US005790942A

United States Patent [19]
Le Corre et al.

[11] Patent Number: 5,790,942
[45] Date of Patent: Aug. 4, 1998

[54] FREQUENCY MODULATION RADIO TRANSMISSION DEVICE

[75] Inventors: Jean-Luc Le Corre, Quimper; Michel Robbe, Conflans Sainte Honorine, both of France

[73] Assignee: Matra Communication, France

[21] Appl. No.: 656,881

[22] Filed: May 30, 1996

[30] Foreign Application Priority Data

May 31, 1995 [FR] France ................... 95 06474

[51] Int. Cl.$^6$ .................................................. H03L 7/00
[52] U.S. Cl. ................. 455/112; 455/113; 455/118; 455/119; 455/110; 332/127; 331/2
[58] Field of Search ..................... 455/112, 110, 455/111, 113, 108, 106, 255, 256, 257, 259, 260, 264, 265, 76, 118, 316–319, 208, 119; 331/2, 8; 332/127

[56] References Cited

U.S. PATENT DOCUMENTS

| | | | |
|---|---|---|---|
| 4,932,072 | 6/1990 | Toko | 455/76 |
| 5,075,639 | 12/1991 | Taya | 331/2 |
| 5,111,162 | 5/1992 | Hietala et al. | 455/76 |
| 5,128,633 | 7/1992 | Martin et al. | 331/2 |
| 5,150,078 | 9/1992 | Yang et al. | 455/260 |
| 5,332,978 | 7/1994 | Yabuki et al. | 331/2 |
| 5,337,005 | 8/1994 | Fenk et al. | 455/76 |
| 5,374,902 | 12/1994 | Bradley | 331/2 |
| 5,408,201 | 4/1995 | Uriya | 455/76 |
| 5,412,353 | 5/1995 | Chaplik et al. | 332/127 |
| 5,640,697 | 6/1997 | Orndorff | 455/255 |

FOREIGN PATENT DOCUMENTS 30 05 952   9/1980   Germany ................... H03B 3/04

Primary Examiner—Tommy P. Chin
Assistant Examiner—Vu Le
Attorney, Agent, or Firm—Evenson, McKeown, Edwards & Lenahan, P.L.L.C.

[57] ABSTRACT

A first phase-locked loop (PLL) includes a first integrated voltage-controlled oscillator (VCO) whose output signal has a frequency modulated by an input signal of the device about a multiple of a reference frequency. A second PLL includes a second integrated VCO and frequency transposition means. The transposition circuit receive the output signal of the second VCO and a transposition signal having a non-modulated frequency. The second PLL addresses to the second VCO a control signal capable of aligning the frequency of the output signal of the transposition circuit with the frequency of the first VCO. The output signal of the second VCO forms the frequency modulation transmission signal produced by the device.

8 Claims, 2 Drawing Sheets

FREQUENCY MODULATION RADIO TRANSMISSION DEVICE

BACKGROUND OF THE INVENTION

The present invention relates to a frequency modulation radio transmission or transmission/reception device. It has a particular, but non-exclusive, application in the base/handset connections for cordless telephone equipments.

The radio frequency transmitters/receivers usually include two independent phase-locked loops (PLL): one for transmission, the other one for reception. Each of these loops comprises a voltage-controlled oscillator (VCO), a phase comparator, a divider and a loop filter. The loop filters are made from discrete components, because the cut-off frequencies of the loops are relatively low, of the order of 100 Hz in the case of the telephone bandwidth (from 300 to 3400 Hz). The VCO's are realized by means of an adjustable inductor and of a voltage-controlled capacitor (varicap).

It is known to make voltage-controlled oscillators with transistors (astable multivibrators), which can be integrated in a silicon chip. However, the disadvantage of those integrated VCO's is that they have an important phase noise, particularly if they have to operate at a relatively high frequency (for instance a few tens of MHz). The loop may compensate for such phase noise if its low-pass filter has a sufficiently high cut-off frequency (typically some tens of kHz); however, such a loop filter would cause cancelling of the desired modulation together with the undesired phase noise.

German patent application 30 05 952 discloses a frequency synthesizer comprising: (I) a modulation PLL whose loop filter has a relatively high time constant; (II) a frequency switch PLL delivering a non-modulated signal having a programmable frequency; and (III) a synthesis PLL whose VCO delivers the output signal of the synthesizer. The latter signal is mixed with the programmable frequency signal. The result of that mixing is submitted to a bandpass filter. A phase comparator compares the phase of the output signal of the bandpass filter to that of the intermediate frequency signal delivered the modulation PLL. The low-pass filter of the synthesis PLL filters the output signal of that phase comparator to drive the VCO. The advantage of that synthetsizer is that the filter having a large time constant in the modulation PLL, which is necessary to get an effective modulation, does not cause long transients when the frequency is switched. It is required that the bandpass filter of the synthesis PLL has a narrow bandwidth around the intermediate frequency in order to eliminate the undesirable intermodulation products. It is thus a high-ordered filter, introducing a phase shift which varies significantly as a function of the frequency. Consequently, it seems that synthetsizer can only be operable if the VCO of the synthesis PLL has a very narrow frequency range, which on the one hand requires in practice stabilization of that VCO with a quartz, and on the other hand raises difficulties to make the synthetsizer really programmable on a frequency range which is not too reduced. That document does not tackle the question of a possible integration of the synthetsizer components with an architecture which enables to circumvent the problem of the phase noise caused by the integrated VCO's.

SUMMARY OF THE INVENTION

An object of the present invention is to enable the elements forming a frequency modulation radio transmission device to be integrated to a large extent.

The invention thus proposes a frequency modulation radio transmission device, comprising a fixed frequency reference signal source, a first phase-locked loop including a first VCO whose output signal has a frequency modulated by an input signal about a multiple of the frequency of the reference signal, and a second phase-locked loop including a second VCO and frequency transposition means. The transposition means receive on the one hand the output signal of the second VCO, and on the other hand a transposition signal having a non-modulated frequency. The second loop addresses to the second VCO a control signal capable of aligning the frequency of the output signal of the transposition means with the frequency of the output signal of the first VCO. The output signal of the second VCO forms the frequency modulation transmission signal produced by the device.

The transposition means include two mixers and a summer arranged to combine the output signal of the second VCO, the transposition signal and $\pi/2$-phase shifted versions of those two signals so as to eliminate from the spectrum of the output signal of the transposition means the frequency component corresponding to the sum of the frequency of the output signal of the second VCO and of the frequency of the transposition signal.

The modulation can then be effected by the first loop at a relatively low frequency, so that the first VCO may be integrated without generating an excessive phase noise within the bandwidth of the input signal. The low-pass filter of the first loop may have a low cut-off frequency, of the order of 100 Hz for instance. The high frequency transposition is performed by the second loop whose low-pass filter may have a substantially higher cut-off frequency (for instance a few tens of kHz) in order to eliminate the phase noise generated by the second VCO operating at a higher frequency. Therefore, both loops may be entirely embodied in the form of an integrated silicon circuit, except for the filter of the first loop whose cut-off frequency is low.

The transposition means eliminate the main undesirable intermodulation component (of frequency $f+f_T$ where f designates the output frequency of the VCO of the second loop and $f_T$ designates the frequency of the transposition signal), without requiring a high-ordered filter. The second loop can thus be stabilized, even if the frequency excursion of the modulated signal is relatively important, without being disturbed by phase fluctuations.

The transposition signal is preferably produced by a third VCO included in a third phase-locked loop, which may also be embodied in integrated form, the third loop addressing to the third VCO a control signal which adjusts the frequency of the transposition signal as a multiple of the frequency of the reference signal. In the case of a transmitter/receiver, the third VCO may be used as a local oscillator for the first demodulation stage in the reception branch.

DESCRIPTION OF PREFERRED EMBODIMENTS

Figure 1:
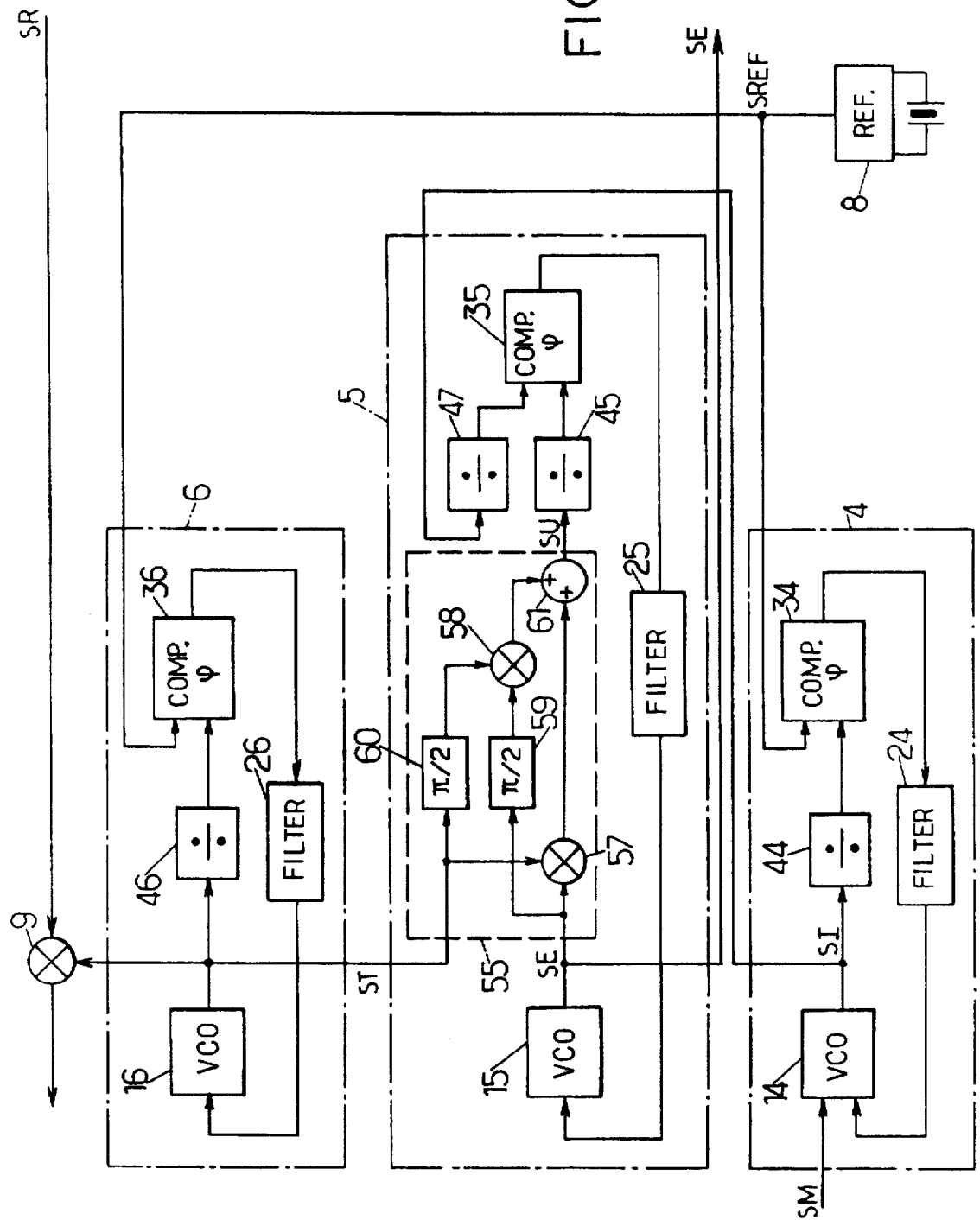
FIG. 1 is a diagram of a frequency modulation radio transmission/reception device according to the invention.

The device shown in FIG. 1 includes three phase-locked loops (PLL) 4, 5, 6. Each loop 4, 5, 6 comprises an astable multivibrator voltage-controlled oscillator (VCO) 14, 15, 16, a low-pass filter 24, 25, 26 and a phase comparator 34, 35, 36. Each filter 24, 25, 26 integrates the comparison signal provided by the corresponding comparator 34, 35, 36 to deliver a frequency adjustment signal to the corresponding VCO 14, 15, 16. Filter 24 of loop 4 has a low cut-off frequency, of for instance 100 Hz. Filters 25, 26 of loops 5, 6 have a relatively high cut-off frequency, of 30 kHz for instance.

The device further includes a source 8 providing a reference signal SREF of fixed frequency. Source 8 may consist of a crystal oscillator associated with a frequency divider. The reference frequency $F_{REF}$ of signal SREF has a relatively high value, for instance a value of 557.5 kHz obtained by dividing by 20 the frequency provided by a quartz oscillating at 11.15 MHz. Such value of the reference frequency enables the choice of the relatively high cut-off frequency of low-pass filter 26, and thus to embody VCO 16 in an integrated form.

VCO 14 of the first loop 4 includes a modulation input receiving the input signal SM of the device, which is typically an analog audio signal in the telephone bandwidth (from 300 to 3400 Hz). The output signal SI of VCO 14 is applied to a frequency divider 44 whose output is connected to one of the inputs of phase comparator 34. The other input of comparator 34 receives the reference signal SREF. The frequency of signal SI is thus modulated by the input signal SM about a frequency $f_I$ which is a multiple, whole or fractional, of the reference $F_{REF}$ of the reference signal: $f_I = x.f_{REF}$, where x designates the frequency division factor applied by divider 44. The control signal applied to VCO 14 by the loop filter 24 permanently tends to bring its oscillation frequency back to $f_I$. Due to its cut-off frequency which is below the telephone bandwidth, filter 24 does not suppress the frequency modulation caused by the input signal SM. Frequence $f_I$ is chosen to be sufficiently low (e.g. 4.3 MHz), so that the integrated astable multivibrator oscillator 14 does not generate an excessive phase noise in the telephone bandwidth.

Reference signal SREF is also applied to an input of phase comparator 36 of the third loop 6. The other input of that comparator 36 is connected to a frequency divider 46 receiving the output signal ST of VCO 16. VCO 16 delivers a transposition signal ST whose frequency $f_T$ is proportional to the reference frequency: $f_T = y.f_{REF}$, where y designates the frequency division factor applied by divider 46. Oscillator 16 is used as a local oscillator for the first demodulation stage of a radio signal SR received by the device. Accordingly, the transposition signal ST is applied to the mixer 9 of the first demodulation stage which performs a frequency transposition towards a first intermediate frequency $f'_I$. If the received signal SR is modulated about a frequency $f_R$, the frequency $f_T$ of the transposition signal is for instance equal to the sum of the intermediate frequency $f'_I$ and of the frequency $f_R$. Typical numerical values are $f_R=26.4$ MHz, $f'_I=10.7$ MHz (French CT0 standard for base-to-handset connections), and thus $f_T=37.1$ MHz.

The second phase-locked loop 5 includes frequency transposition means 55 receiving on the one hand the output signal SE of oscillator 15, and the other hand the transposition signal ST provided by oscillator 16. Those transposition means 55 comprise two mixers 57, 58 to $\pi/2$-phase shifters 59, 60, and an adder 61. Mixer 57 has two inputs which respectively receive the signals SE and ST, and an output connected to an input of adder 61. Mixer 58 has two inputs which respectively receive the signals SE and ST, phase-shifted by $\pi/2$ by phase shifters 59, 60, and an output connected to the other input of adder 61. Adder 61 provides the output signal SU of the transposition means 55. The combination applied by means 55 eliminates from the spectrum of signal SU the frequency components corresponding to sums of the frequencies contained in the signals SE and ST.

Loop 5 servo-controls the oscillation frequency of VCO 15, so that the frequency of the output signal SU of transposition means 55 coincide with the frequency of the output signal SI of VCO 14 of the first loop 4. Depending on the characteristics of the phase comparator 35, it may be useful to divide the frequencies of signals SU and SI before applying those signals to comparator 35. Accordingly, it may be provided that the second loop 5 includes two frequency dividers having the same ratio, one 45 receiving signal SU and connected to an input of comparator 35, and the other one 47 receiving signal SI and connected to the other input of comparator 35. The frequency division factor applied by dividers 45, 47 is for example 4, so that phase comparator 35 operates at a frequency of the order of 1 MHz.

The output signal SE of VCO 15 is the frequency modulation transmission signal produced by the device. The frequency f of that signal SE is modulated in accordance with the output signal SM about the frequency $f_E=f_T+f_I$. The transposition means 55, as they are arranged in loop 5, make it possible to eliminate from the spectrum of oscillator 15 the components whose frequency is close to $f_T-f_I$. The phase noise which may be introduced by the astable multivibrator oscillator 15 is compensated by filter 25 whose cut-off frequency is relatively high, without altering the modulation included in the reference SI applied to phase comparator 35. In the particular example of handset-to-base connections in the French CT0 standard, where the transmission signal SE is to be modulated about a frequency $f_E=41.4$ MHz, the intermediate frequency $f_I=f_E-f_T=f_E-f_R-f'_I=4.3$ MHz is to be selected.

The device shown in FIG. 1 may also be suitable for supporting several transmission and reception channels, in particular when the duplex distance (difference between the transmission and reception frequencies) is constant. In such a case, changing the transmission and reception channels is simply effected by modifying the division factor applied by divider 46 of the third loop 6. Accordingly, divider 46 is preferably adjustable, with a fractional ratio. It is observed that the first loop 4 which performs the modulation by the input signal SM does not bring in any delay in the establishment of the frequencies upon a channel change.

Owing to the high cut-off frequencies of filters 25 and 26, it is also possible to embody them in integrated form. Accordingly, in a practical application of the invention, the three loops 4, 5, 6 may be integrated in the same silicon chip, except filter 24 of the first loop whose cut-off frequency is relatively low.

It is noted that the combination applied by the mixers and the summer of the frequency transposition means in order to remove from signal SU the components of frequency $f+f_T$ may be different to the one illustrated in FIG. 1. For instance, in the example of the transposition means 155 shown in FIG. 2, the summer (which is generally meant to perform an algebraic sum) is a subtracter 161 whose inputs are connected to the respective outputs of two mixers 157, 158. Mixer 158 receives signal SE and transposition signal ST phase-shifted by $\pi/2$ by phase shifter 160, while mixer 158 receives signal ST and signal SE phase-shifted by $\pi/2$ by phase shifter 159. The combination thus produced at the output of subtracter 161 differs only by a constant phase shift of $\pi/2$ with respect to that produced at the output of adder 61 in FIG. 1.

Figure 2:
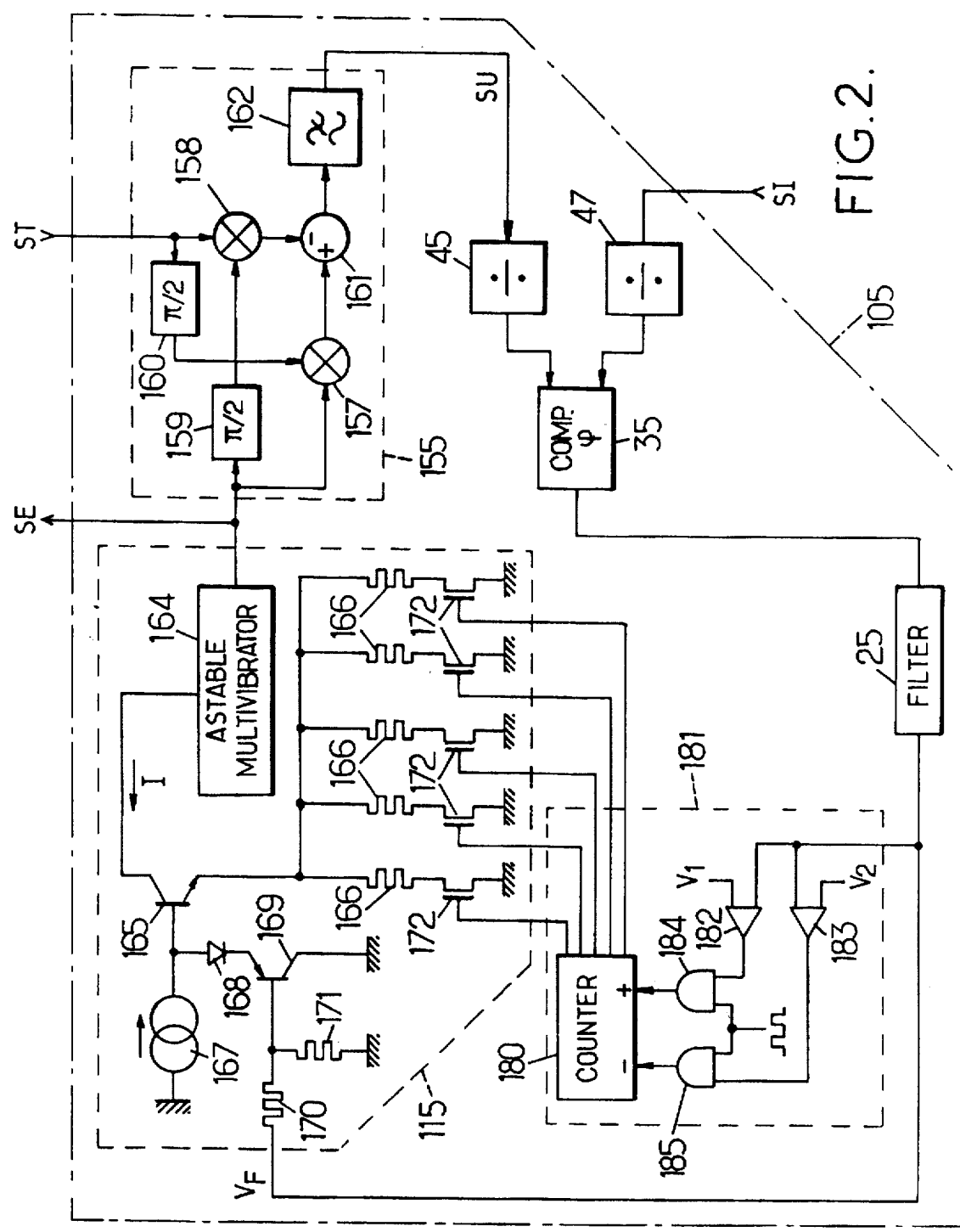
FIG. 2 shows an alternative embodiment of a phase-locked loop of the device of FIG. 1.

As shown in FIG. 2, summer 161 of frequency transposition means 155 may be followed by a low-pass filter 162 whose purpose is to attenuate, in signal SU, the intermodulation components of order 2, of frequencies $2f_T-f_E$, $2f_E-f_T$, $3f_T-f_E$ etc . . . . This filter must have a low order and a relatively weak slope so as not to induce phase/frequency dependencies about frequency $f_T$. In the case of the above-mentioned numerical values, the cut-off frequency of filter 162 is for instance of the order of 12 MHz.

FIG. 2 shows a loop 105 which may be used instead of the second loop 5 in a device as the one shown in FIG. 1. Frequency dividers 45, 47, phase comparator 35 and loop filter 25 are arranged in the same way as in the embodiment of FIG. 1.

FIG. 2 shows the astable multivibrator 164 of VCO 115 of the second loop 105. The frequency f of the output signal SE of multivibrator 164 is proportional to a control current I provided by the collector of a npn transistor 165. The emitter of that transistor 165 is connected to ground through a programmable array of parallel resistors 166, whose overall resistance is noted $R_{DA}$. A current generator 167 has its output connected on the one hand to the base of npn transistor 165, and on the other hand, through a diode 168, to the emitter of a pnp transistor 169 whose collector is grounded. The base of transistor 169 is connected to two resistors, one 170 having a resistance $R_1$ and receiving the output voltage $V_F$ of loop filter 25, and the other one 171 having a resistance $R_2$ and connected to ground. With this arrangement of VCO 115, the frequency f of signal SE is proportional to the current I given by $$I = \frac{1}{R_{DA}} \left( V_{BE} + \frac{R_1}{R_1 + R_2} V_F \right)$$

where $V_{BE}$ is the base-emitter voltage of transistor 165. The above relationship shows the linear relationship between the control voltage $V_F$ of the VCO and the output frequency. It also emphasizes a programmable scaling factor $1/R_{DA}$.

For the programmation of that factor $1/R_{DA}$, each resistor 166 of the array is connected to ground through a MOS switch 172 controlled by a respective output bit of a digital counter 180. Resistors 166 have individual resistances scaled as powers of 2, so that factor $1/R_{DA}$ is proportional to the value of counter 180.

Counter 180 forms part of a logic circuit 181 whose purpose is to periodically activate a stepping variation of the output frequency of VCO 115 when the output of phase comparator 35 is out of the linear domain. To this end, logic circuit 181 includes, in the illustrated example, two voltage comparators 182, 183 and two AND gates 184, 185. These two gates receive a clock signal, of frequency 1 kHz for instance, which sets the period of the stepping variation. Gate 184 is connected to the output of comparator 182 so as to control incrementation of counter 180 when the output voltage $V_F$ of loop filter 25 is below a threshold $V_1$. Gate 185 is connected to the output of comparator 183 so as to control decrementation of counter 180 when voltage $V_F$ exceeds a threshold $V_2$. The thresholds $V_1$ and $V_2$ are selected to be on either side of the linear domain of phase comparator 35 (for instance $V_1=0.5$ V, $V_2=V_{DD}-V_1$ where $V_{DD}$ designates the positive reference voltage of the integrated circuit).

Such variation of the scaling factor $1/R_{DA}$ ensures the independence of the device operation with respect to variations due to semi-conductor manufacturing processes. It further ensures pulling in of the loop in large value ranges for the frequencies $f_E$ and $f_T$.

When a low-pass filter 162 is used in the frequency transposition means 155, it is possible to detect transitions at the output of this filter, and to modify the value of counter 180, to recycle the stepping variation of the VCO frequency, when no transition is detected. This avoids that, at the initialization, an important deviation (larger than the bandwidth of filter 162) between frequencies $f_T$ and $f_E$ prevents correct stabilization of the loop.

We claim:

1. A frequency modulation radio transmission device, comprising:

a fixed frequency reference signal source, a first phase-locked loop including a first voltage-controlled oscillator which produces an output signal having a frequency modulated by an input signal of the device about a multiple of the fixed frequency of the reference signal; and a second phase-locked loop including a second voltage-controlled oscillator and frequency transposition means, the transposition means receiving on the one hand an output signal of the second voltage-controlled oscillator and on the other hand a further signal having a non-modulated frequency, the second phase-locked loop addressing to the second voltage-controlled oscillator a control signal for aligning the frequency of an output signal of the transposition means with the frequency of the output signal of the first voltage-controlled oscillator, wherein the output signal of the second voltage-controlled oscillator is a frequency modulation transmission signal produced by the device, and wherein the transposition means include two mixers and a summer arranged to combine the output signal of the second voltage-controlled oscillator, said further signal, the output signal of the second voltage-controlled oscillator phase shifted by $\pi/2$ and said further signal phase shifted by $\pi/2$ so as to eliminate from a spectrum of the output signal of the transposition means the frequency component corresponding to a sum of the frequency of the output signal of the second voltage-controlled oscillator and of the frequency of said further signal.

2. A device according to claim 1, wherein said further signal is produced by a third voltage-controlled oscillator included in a third phase-locked loop, the third phase-locked loop addressing to the third voltage-controlled oscillator a control signal which adjusts the frequency of said further signal as a multiple of the fixed frequency of the reference signal.

3. A device according to claim 2, which is further suitable for receiving a frequency modulation radio signal, wherein said further signal is further applied to a mixer of a first radio demodulation stage which ensures a transposition of the received radio signal toward an intermediate frequency.

4. A device according to claim 3, wherein the frequency of said further signal is equal to the sum of said intermediate frequency and of a frequency about which the received radio signal is modulated, and wherein the output signal of the first voltage-controlled oscillator is modulated about a frequency equal to a difference between a frequency about which the transmission signal is to be modulated and the frequency of the transposition signal.

5. A device according to claim 1, wherein the transposition means include a first mixer receiving the output signal of the second voltage-controlled oscillator and said further signal, two π/2-phase shifters, one receiving the output signal of the second voltage-controlled oscillator, and the other one receiving said further signal, a second mixer receiving respective output signals of said two phase shifters, and an adder receiving respective output signals of the first and second mixers and delivering the output signal of the transposition means.

6. A device according to claim 1, wherein each of said voltage-controlled oscillators comprises an integrated astable multivibrator.

7. A device according to claim 6, wherein said phase-locked loops are entirely integrated in a single chip, except a low-pass filter forming part of the first phase-locked loop.

8. A device according to claim 1, wherein the second phase-locked loop includes a logic circuit to cause a stepping variation of the output frequency of the second voltage-controlled oscillator when a control voltage addressed to the second voltage-controlled oscillator is out of a predetermined interval.

* * * * *